(12) United States Patent
Wong

(10) Patent No.: US 8,890,535 B2
(45) Date of Patent: Nov. 18, 2014

(54) POWER SUPPLY AGING SYSTEM AND LOAD BALANCE CONTROL METHOD

(76) Inventor: Hon Ki Wong, Hong Kong (HK)

( * ) Notice: Subject to any disclaimer, the term of this patent is extended or adjusted under 35 U.S.C. 154(b) by 225 days.

(21) Appl. No.: 13/701,832

(22) PCT Filed: May 6, 2011

(86) PCT No.: PCT/CN2011/073781
§ 371 (c)(1),
(2), (4) Date: Dec. 4, 2012

(87) PCT Pub. No.: WO2011/150733
PCT Pub. Date: Dec. 8, 2011

(65) Prior Publication Data
US 2013/0069666 A1 Mar. 21, 2013

(30) Foreign Application Priority Data
Jun. 4, 2010 (HK) .................. 10105547.5

(51) Int. Cl.
*G01R 31/28* (2006.01)
*H02J 3/36* (2006.01)
*G01R 31/40* (2014.01)
*H02J 3/38* (2006.01)

(52) U.S. Cl.
CPC ............ *G01R 31/2849* (2013.01); *G01R 31/40* (2013.01); *H02J 3/383* (2013.01); *Y02E 10/563* (2013.01)

USPC ............................................ 324/511; 363/35

(58) Field of Classification Search
CPC ..... G01R 31/2849; G01R 31/40; H02J 3/383; Y02E 10/563
USPC ......... 324/500, 510, 511, 537, 764.01, 76.11, 324/103 R, 119, 607; 323/205, 207; 340/333; 361/52, 235, 601; 363/15, 34, 363/35, 51
See application file for complete search history.

(56) References Cited
U.S. PATENT DOCUMENTS 6,614,231 B2 * 9/2003 Thrap ........................... 324/416
2013/0249397 A1 * 9/2013 Chandran et al. ................ 315/85

* cited by examiner

Primary Examiner — Hoai-An D Nguyen

(57) ABSTRACT

A power supply aging system and a load balance control method. The power supply aging system includes: a system share supply unit (201) for producing a DC voltage for the need of the system constant current balance, a renewable load unit (202) for converting a low DC voltage outputted by a unit under test (200) to a high DC voltage, a DC to AC converting unit (203) for converting the high DC voltage to the AC voltage needed by the unit under test. The AC voltage is transmitted to the unit under test through a renewable AC bus. The system does not need any isolation transformer or the authorization from power supplying enterprises. The system can balance the DC load sharing, reduce the cost, improve the efficiency of electrical energy feedback and reduce the energy waste.

19 Claims, 11 Drawing Sheets

POWER SUPPLY AGING SYSTEM AND LOAD BALANCE CONTROL METHOD

FIELD OF THE PATENT APPLICATION

The present patent application relates to power electronics field, and more particularly to a power supply aging system and load balance control method.

BACKGROUND

In order to achieve high reliability, electronic products generally required to undergo an aging process at full power before delivery. A common aging system utilizes a resistor as the power load, in which case electrical energy is wasted due to heat conversion. Besides, in order to control indoor temperature, a large quantity of exhaust systems are required for displacing the heat to outdoor hence increasing the environment temperature.

Currently, there are some power supply aging methods and systems which have achieved energy recycling by decreasing energy loss and reducing the heat discharged through the feedback of aging energy. FIG. 1 is a diagram illustrating an example of the power supply aging system disclosed in the prior art. In FIG. 1, a unit under test (UUT) outputs a direct current to a direct current/alternating current inverter (DC/AC Inverter) through a direct current bus (DC Bus), then the direct current/alternating current inverter feeds back an alternating current to the unit under test through a renewable AC bus.

However, during the implementation of the present patent application, the inventor has pointed out that the prior art has following defects; An isolation transformer is required to be installed due to the interference of AC line on the existing power supply aging system. Therefore, an authorization from power supplying authority is required, thereby increasing the cost. Moreover, since the loading power of the existing power supply aging system is fixed, it cannot meet the demand of the unit under test. Furthermore, energy is wasted due to low feedback efficiency.

SUMMARY

In order to control the load balance, a power supply aging system is provided in the present patent application. The power supply aging system comprises:

a system share supply unit, which is configured to connect with an AC line and output fixed voltage to a high voltage DC bus and produce a DC voltage;

a renewable load unit, which is configured to connect with a unit under test and in parallel with the system share supply unit and output a constant current to the high voltage DC bus;

a DC to AC converting unit, which is configured to connect with the high voltage DC bus, and output to a renewable AC bus and convert a high DC voltage to an AC voltage required by the unit under test;

a switching unit, which is configured on one end to connect with the unit under test and on the other end connect with the AC line or the renewable AC bus, for selecting the AC line or the renewable AC bus to provide the unit under test with the AC voltage required by the unit under test by switching;

a control unit, which is configured to monitor the states of the system share supply unit, the renewable load unit, the DC to AC converting unit and the switching unit in real-time, and further adjust and control the above mentioned units in real-time; wherein the control unit is also configured to maintain a constant current balance of the power supply aging system by increasing and decreasing an output current of the system share supply unit and/or selecting the AC line or the renewable AC bus as a power supply of the unit under test.

Meanwhile, a load balance control method is also provided in the present patent application, which includes the following processes:

connecting a system share supply unit with a renewable load unit in parallel through a high voltage DC bus, and outputting a DC voltage to a DC to AC converting unit;

converting the DC voltage to an AC voltage by the DC to AC converting unit for feeding back to a unit under test and outputting through a renewable AC bus;

monitoring the states of the system share supply unit, the renewable load unit and the DC to AC converting unit in real time, adjusting and controlling the above mentioned units in real-time by a control unit;

switching according to the instruction given by the control unit by a switching unit for selecting between an AC line or the renewable AC bus to be connected to an input terminal of the unit under test and for providing the unit under test with the AC voltage needed by the unit under test.

The advantageous effects of the present patent application are that the system share supply unit and the renewable load unit output in parallel to the DC to AC converting unit; the DC to AC converting unit feeds back the AC voltage to the renewable AC bus; the DC output of the system share supply unit is adjusted, or the switching unit selects the AC line or the renewable AC bus to access the unit under test through the real-time monitoring and control of the control unit. Therefore, the DC load sharing can be balanced so that the system and the AC line will not interfere with each other. Accordingly, neither the installation of isolation transformer nor the authorization from power supplying authority is required, thereby reducing cost. Meanwhile, the application condition is simplified and operational safety and reliability are enhanced. In addition, the feedback efficiency is improved so as to further minimize waste of energy.

BRIEF DESCRIPTION OF THE DRAWINGS

Illustrative drawings provided herein which constitute a part of the present application are used to provide further understanding of the present patent application rather than being construed as limitation to the same.

DETAILED DESCRIPTION OF THE PREFERRED EMBODIMENT

The embodiments of the present patent application will be further described in detail with reference to the accompanying drawings below. Herein, the exemplary embodiments and their descriptions in the present patent application are used for exemplary illustration rather than limiting the present patent application.

Embodiment 1

Figure 1:
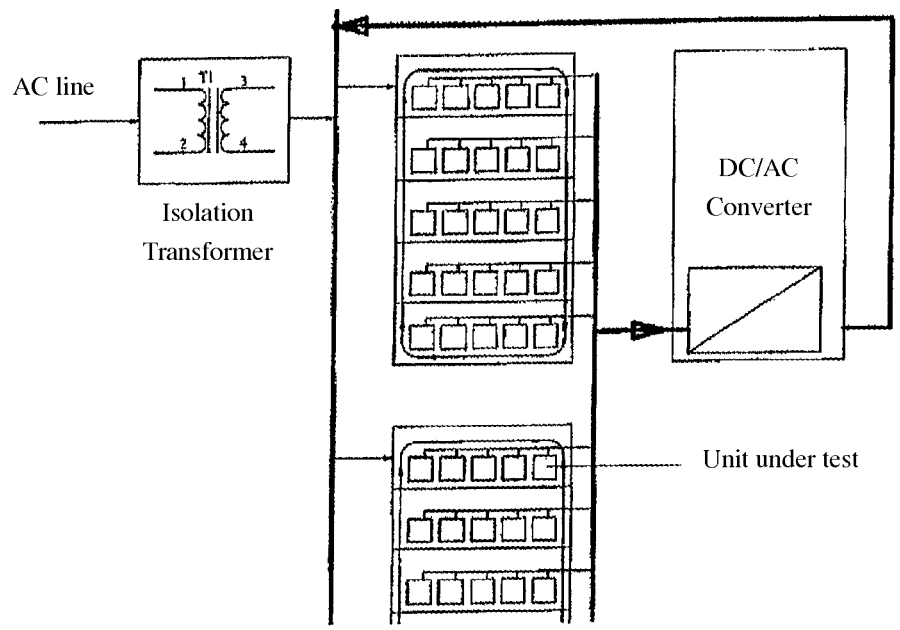
FIG. 1 is a diagram illustrating an example of the power supply aging system in the prior art.
Figure 2:
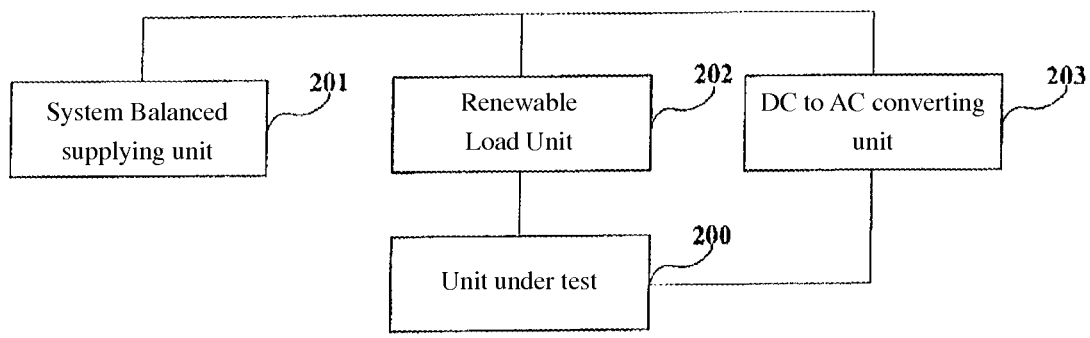
FIG. 2 is a structure diagram illustrating the power supply aging system in an embodiment 1 of the present patent application.

This embodiment of the present patent application provides a power supply aging system. As shown in FIG. 2, the power supply aging system comprises a system share supply unit 201, a renewable load unit 202 and a DC to AC converting unit 203.

The system share supply unit 201 connects with an AC line for outputting to a high voltage DC bus and producing a direct current for the need of the constant current balance of the power supply aging system. The system share supply unit 201 outputs a fixed voltage and maintains the constant current balance of the power supply aging system by increasing or decreasing its output current.

The renewable load unit 202 connects with a unit under test 200. The renewable load unit 202 further connects with the system share supply unit 201 in parallel, and outputs to the high voltage DC bus after up conversion. The renewable load unit 202 is configured to convert a low voltage direct current outputted by the unit under test 200 to a high voltage direct current and outputs a constant current.

The DC to AC converting unit 203 connects with the high voltage DC bus and outputs to a renewable AC bus. The DC to AC converting unit 203 is configured to convert the high DC voltage to the AC voltage needed by the unit under test 200, which is then fed back to the unit under test 200 through the renewable AC bus.

In this embodiment, the system share supply unit 201 may include an AC/DC converting unit which is set to output the fixed current. The input terminal of the system share supply unit 201 connects with the AC line so extracting electricity from the AC line is possible.

In this embodiment, the renewable load unit 202 may include a DC/DC converting unit which is set to output constant current. Moreover, the output voltage of the renewable load unit is set to be 3-5% higher than the fixed voltage of the system share supply unit 201.

In addition, there can be one or more renewable load units 202, each of which is connected with one unit under test 200. The renewable load unit 202 can be program controlled, while its input terminal can be coupled to different voltages and currents. Therefore, different currents can be loaded in accordance with the specification of the unit under test 200 so as to meet the demand of the unit under test 200.

In this embodiment, the system share supply unit 201 and the renewable load unit 202 output to the high voltage DC bus (HVDC Bus) in parallel. Therefore, constant current balance of DC Load Sharing can be carried out to realized constant current balance of the whole system. Due to the utilization of internal grid-connection, the system and the AC line will not interfere with each other. Accordingly, neither the installation of isolation transformer nor the authorization from power supplying department is needed and therefore reducing the cost.

In addition, in this embodiment, the auto-balance operation of feeding back the electrical energy in the overall unit which is balanced by the principle of the DC load sharing balancing was used. Further, by utilizing high speed hardware self-adopting balancing, busy communication resulting from utilization of software is alleviated and the occurrence of error is as well reduced.

In this embodiment, the DC to AC converting unit 203 can be used to convert the high voltage DC to the voltage and frequency needed by the unit under test 200, then produce a digital sine wave to drive an IGBT switch tube through digital signal processing (DSP), filter out high frequency portion through LC filtering to output a pure sine wave AC voltage, and then feed back the AC voltage to the unit under test 200 through the renewable AC bus (also called Renewable AC Line). Different power ratings of the DC to AC converting unit 203 (such as 1 KW, 2 KW or 3 KW) are available for the requirements of different products. Therefore, feedback efficiency is increased so as to further reduce energy waste.

In this embodiment, the internal grid-connection method is employed in the power supply aging system, in which the grid-connection method in the prior art is replaced by the DC constant current balance load sharing. Hence, the application condition is simplified, while the operational safety and the reliability are enhanced.

It can be seen from the above-mentioned embodiment that the system share supply unit and the renewable load unit output are in parallel to the DC to AC converting unit through the high voltage DC bus, and the DC to AC converting unit feeds back the AC voltage to the unit under test through the renewable AC bus. Therefore, the DC load sharing can be balanced without the installation of isolation transformer or the authorization from power supplying department, thus reducing the cost. Additionally, the feedback efficiency can be increased so as to further reduce energy waste.

Embodiment 2

Figure 3:
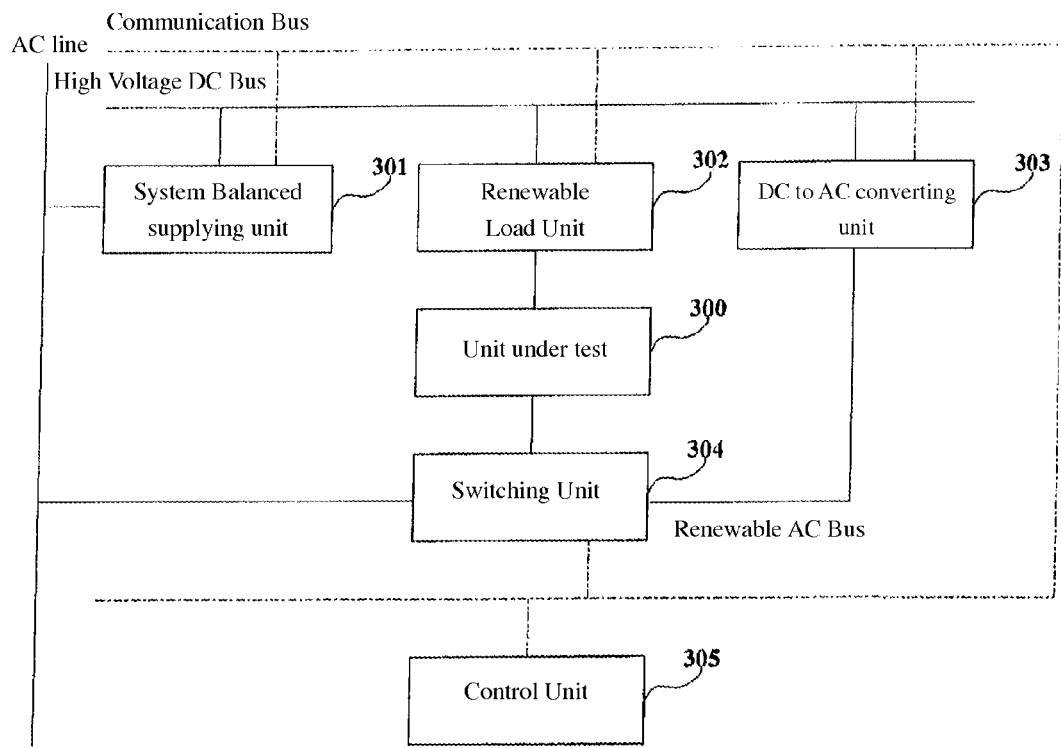
FIG. 3 is a structure diagram illustrating the power supply aging system in an embodiment 2 of the present patent application.

This embodiment of the present patent application provides a power supply aging system. As shown in FIG. 3, the power supply aging system includes a system share supply unit 301, a renewable load unit 302 and a DC to AC converting unit 303. All of these are the same as those described in the embodiment 1.

As shown in FIG. 3, the power supply aging system may further include a switching unit 304.

One end of the switching unit 304 connects with the unit under test 300 and the other end of the switching unit 304 connects with the AC line or the renewable AC bus for providing the unit under test 300 with the alternating current needed by the unit under test 300 from the AC line or the renewable AC bus through switching a switch.

Therefore, the switching unit 304 enables the input terminal of the unit under test to connect with the AC line to produce system share energy, or to connect with the renewable AC bus to obtain a feedback renewable energy. As a result, both the power of system loss and the overall efficiency of system can be enhanced.

As shown in FIG. 3, the power supply aging system may further include a control unit 305.

The control unit 305 is configured to monitor the states of the system share supply unit 301, the renewable load unit 302, the DC to AC converting unit 303 and the switching unit 304, and to further adjust and control the same in real-time.

In this embodiment, the control unit 305 may include a digital signal processing (DSP) unit. TMS320F2808 can be used to carry out real-time control. Therefore, the input voltage/current and the output voltage/current of each unit can be monitored. Besides, the switch current of the Power Stage power tube can also be monitored.

In this embodiment, RS 422 can be used as the communication mode in the control unit 305. It is also possible to carry out the monitoring and the data logging by means of parameter setting and reading through software. The specific implementation may be determined according to the actual condition instead of the above limiting example.

Figure 4:
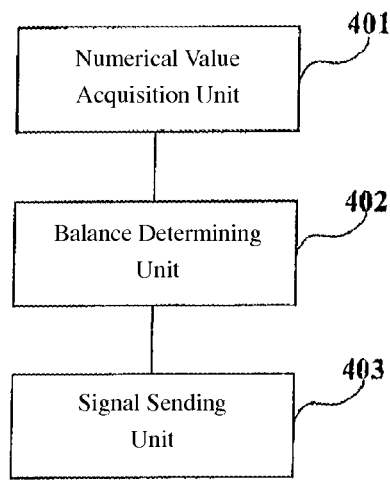
FIG. 4 is a structure diagram illustrating the control unit in an embodiment 2 of the present patent application.

As shown in FIG. 4, the control unit 305 may specifically include a numerical value acquisition unit 401, a balance determining unit 402 and a signal sending unit 403.

The numerical value acquisition unit 401 is configured to acquire the currents and voltages of the system share supply unit 301, the renewable load unit 302, the DC to AC converting unit 303 and the switching unit 304.

The balance determining unit 402 is configured to determine whether the power supply aging system is under a balance operation according to the numerical value acquired by the numerical value acquisition unit 401.

The signal sending unit 403 is configured to send a control signal to the system share supply unit 301 when the balance determining unit 402 determines that the system is out of the balance operation, it adjusts the output power of the system share supply unit 301. As a result, it is possible tore-achieve system constant current balance.

In this embodiment, both the balance determining unit and the signal sending unit of the control unit 305 can be implemented by a micro control unit (MCU). The specific implementation may be determined according to the specific condition.

As shown in FIG. 3, the power supply aging system may include a plurality of switching units 304, each of which is connected with one unit under test 300.

The signal sending unit 403 is also configured to send a control signal to at least one of the plurality of switching units 304 when the balance determining unit 402 determines that the system is out of the balance operation and switches at least one switching unit. As a result, it is possible to re-achieve system constant current balance.

Hereinafter, the power supply aging system and the workflow thereof will be further described in details by examples with reference to FIGS. 5-9.

Figure 5:
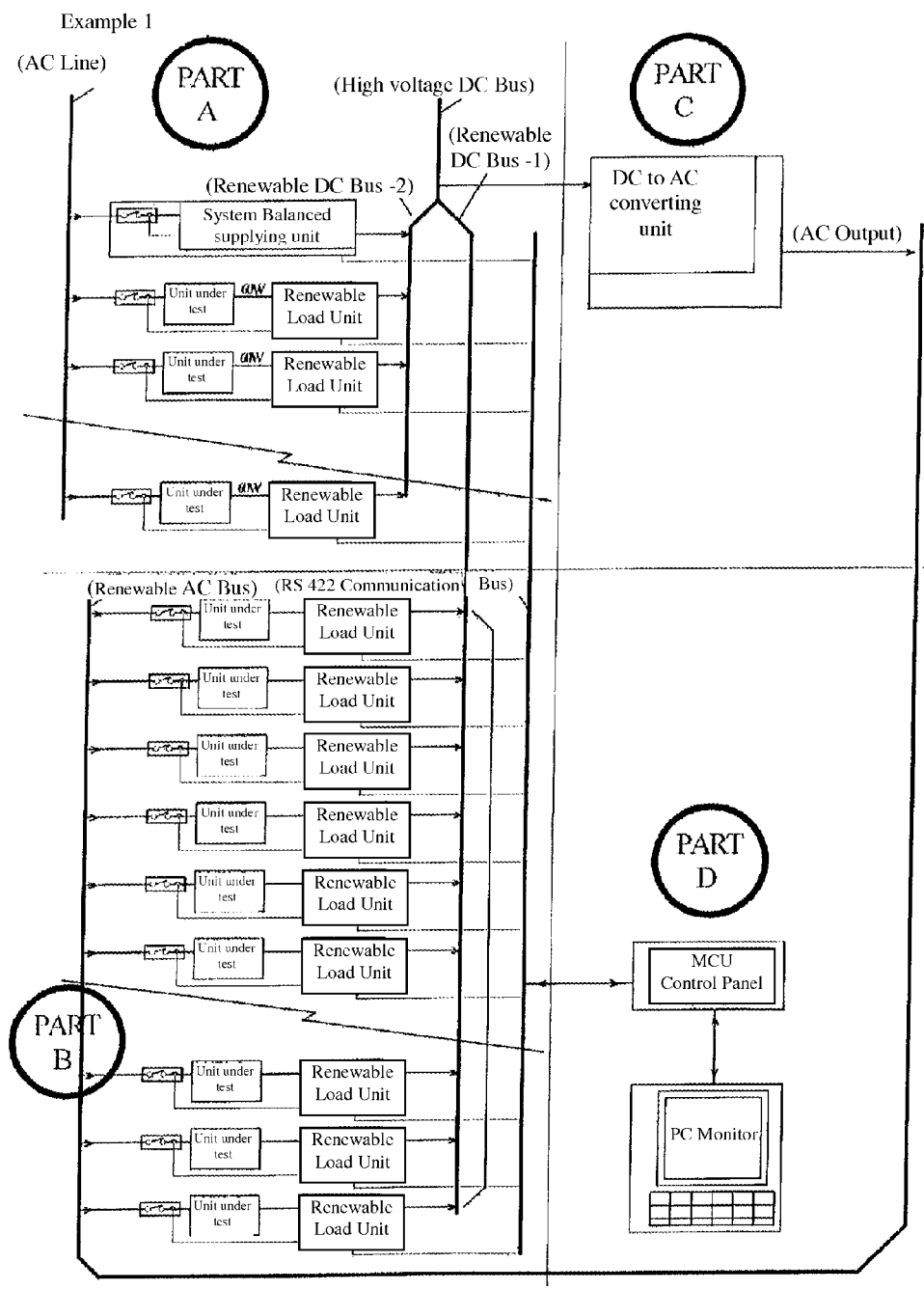
FIG. 5 is a diagram illustrating an example of the power supply aging system in an embodiment 2 of the present patent application.

FIG. 5 is a diagram illustrating an example of the power supply aging system. As shown in FIG. 5, the power supply aging system comprises one system share supply unit, fifty-two renewable load units and one DC to AC converting unit. It further comprises one control unit, units under test and switching units, wherein each renewable load unit corresponds to one unit under test and one switching unit. Thirteen switching units are used to connect the AC line with the unit under tests, and another thirty-nine switching units are used to connect the renewable AC bus and the unit under tests.

In this embodiment, the power and efficiency of the DC to AC converting unit are 3 KW and 90% respectively. The output power, efficiency and input consumption power of the unit under test are 60 KW, 88% and 68.2 KW respectively. The efficiency, output power and input consumption power of the system share supply unit are 90%, 22.5 KW and 25 KW respectively. The efficiency of the renewable load unit is 94%.

In this embodiment, the power supply aging system can be partitioned into four parts for the convenience of calculation and detailed description.

Part A) comprises one system share supply unit, thirteen switching units, thirteen unit under tests and thirteen renewable load units. Regarding this part, its input terminals are connected with the AC line while its outputs are connected to the high voltage DC bus.

In the case of constant current balance, the power required by the input of part A is determined as: 68.2 W*13+25 W=911.6 W; the power output to the high voltage DC bus is determined as: (60 W*94%)*13+22.5 W=755.7 W.

Part B) comprises thirty-nine switching units, thirty-nine unit under tests and thirty-nine renewable load units. Regarding this part, its input terminals are connected with the renewable AC bus while its outputs are connected to the high voltage DC bus.

In the case of constant current balance, the power required by the input of part B is determined as: 68.2 W*39=2659.8 W; the power output to the high voltage DC bus is determined as: (60 W*94%)*39=2199.6 W.

Part C) comprises one DC to AC converting unit. Regarding this part, its input terminal is connected with the high voltage DC bus while its output is connected to the renewable AC bus.

In the case of constant current balance, the input power of part C is determined as: 755.7 W+2199.6 W=2955.3 W; the output power is 2659.8 W.

Part D) comprises one control unit, of which the micro control unit (MCU) communicates with and sends the control instruction to each unit of the system in the manner of RS422 through a communication bus. The micro control unit may be connected with a PC Monitor or a host computer. The host computer may perform monitoring, data logging and parameter setting on the MCU by adoption of RS422 through a communication bus.

It can be seen from the above-mentioned power supply aging system that the electricity acquired from the AC line in this power supply aging system is 911.6 W. However, the power consumption would be 68.2*52=3546.4 W if all of the fifty-two unit under tests are directly connected with the AC line. Therefore, the electrical energy saved through this power supply aging system is determined as: (3546.4−911.6)/3546.4=74.29%.

Figure 6:
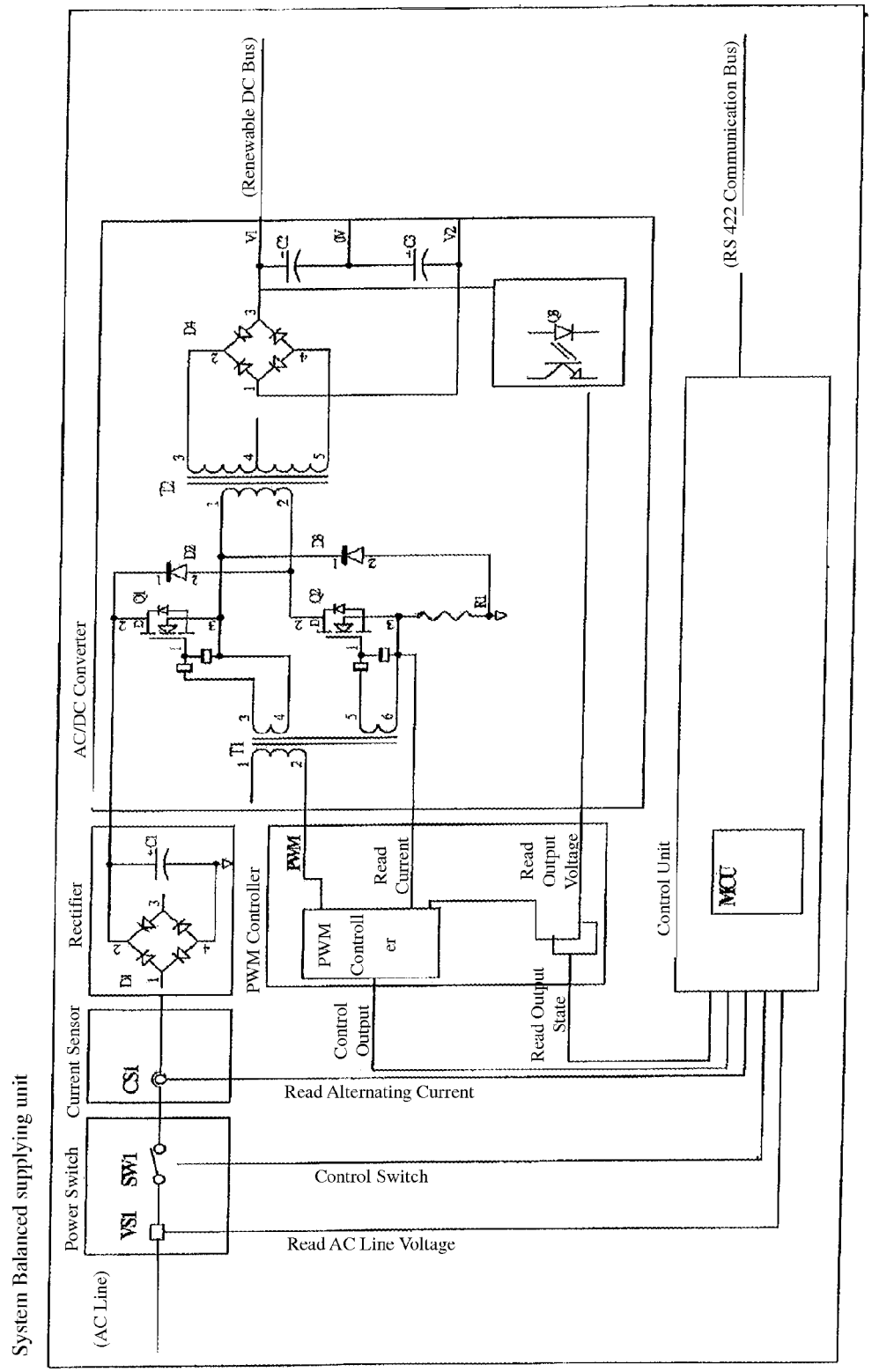
FIG. 6 is a diagram illustrating an example of the system share supply unit in an embodiment 2 of the present patent application.

FIG. 6 is a diagram illustrating an example of the system share supply unit in FIG. 5. As shown in FIG. 6, the system share supply unit may comprise a pulse width modulation (PWM) controller, an AC/DC converter, a rectifier and so on. The specific implementation of the system share supply unit may be determined according to the specific condition instead of the above limiting example. The input AC line is initially rectified by the rectifier and then converted to the constant direct current by the AC/DC converter. The constant direct current is then outputted to the regenerated DC bus. The PWM controller receives the control signal from the control unit and provides a PWM signal for the AC/DC converter so as to realize a constant voltage control on the output of the AC/DC converter. Meanwhile, the PWM controller samples the voltage signal outputted by the AC/DC converter and feeds it back to the control unit.

Figure 7:
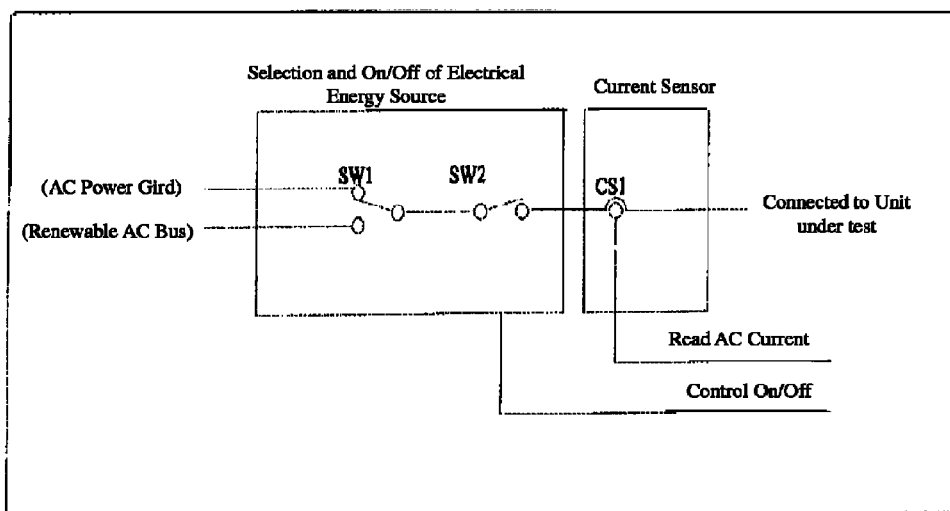
FIG. 7 is a diagram illustrating an example of the switching unit in an embodiment 2 of the present patent application.

FIG. 7 is a diagram illustrating an example of the switching unit in FIG. 5. As shown in FIG. 7, the switching unit may comprise a transfer switch SW1 and a switch SW2. The specific implementation of the switching unit may be determined according to the specific condition and not bound by the above limiting example. The transfer switch SW1 has two input contacts, one of which is connected with the AC line while the other is connected with the renewable AC bus. The input contacts are switched according to the control signal from the control unit so that the AC line or the renewable AC voltage is selected to access the unit under test.

Figure 8:
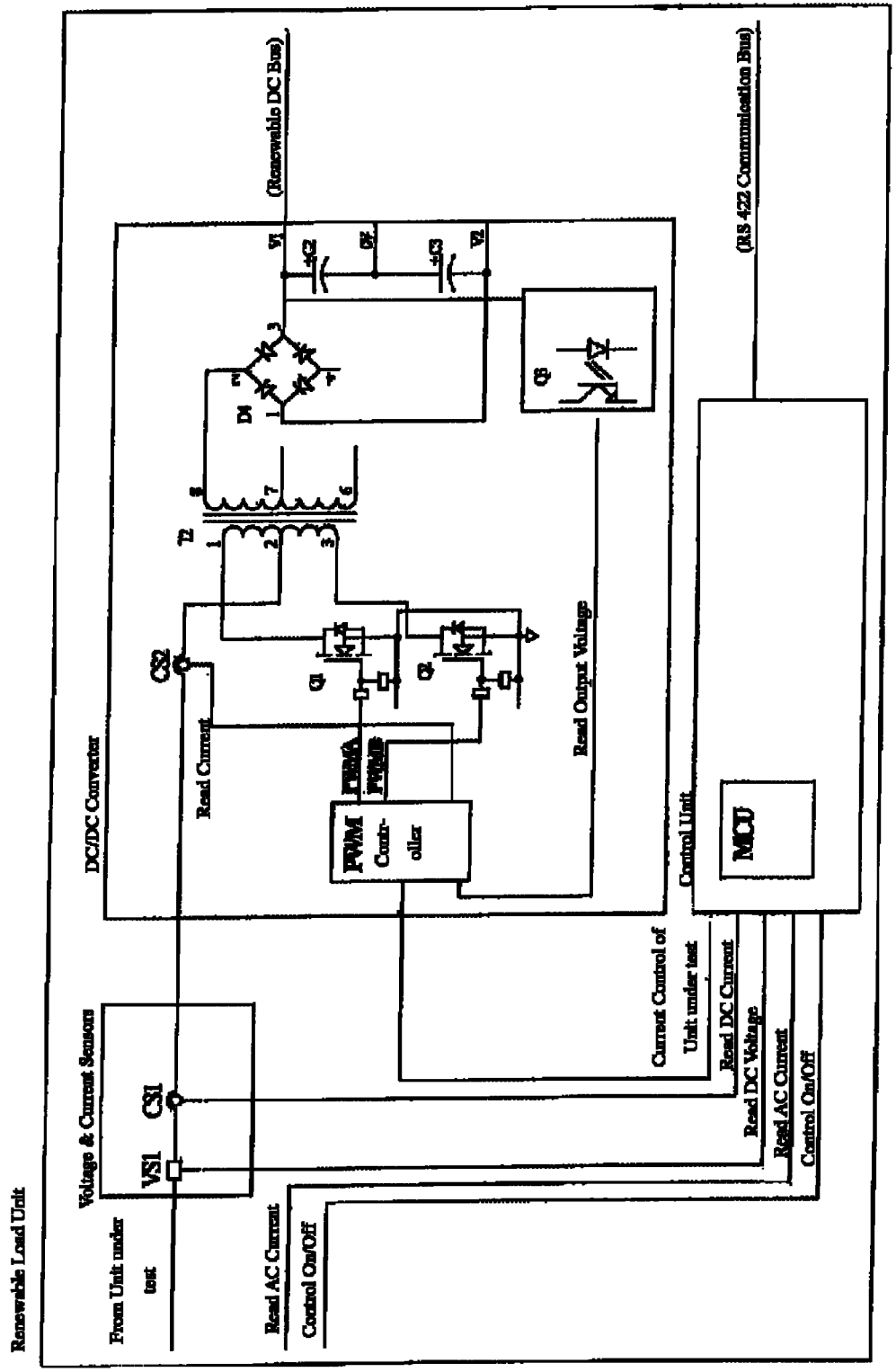
FIG. 8 is a diagram illustrating an example of the renewable load unit in an embodiment 2 of the present patent application.

FIG. 8 is a diagram illustrating an example of the renewable load unit in FIG. 5. As shown in FIG. 8, the renewable load unit may comprise a DC/DC converter and so on. The specific implementation of the renewable load unit may be determined according to the specific condition and not bound by the above limiting example. The DC/DC converter comprises a PWM controller, a switch module, a transformer and a rectifier. Under the control of the control unit, the PWM signal produced by the PWM controller drives the switch module to resonate. A voltage change is carried out on a resonance signal by the transformer, and the rectifier outputs a smooth DC to the renewable AC bus after rectification.

Figure 9:
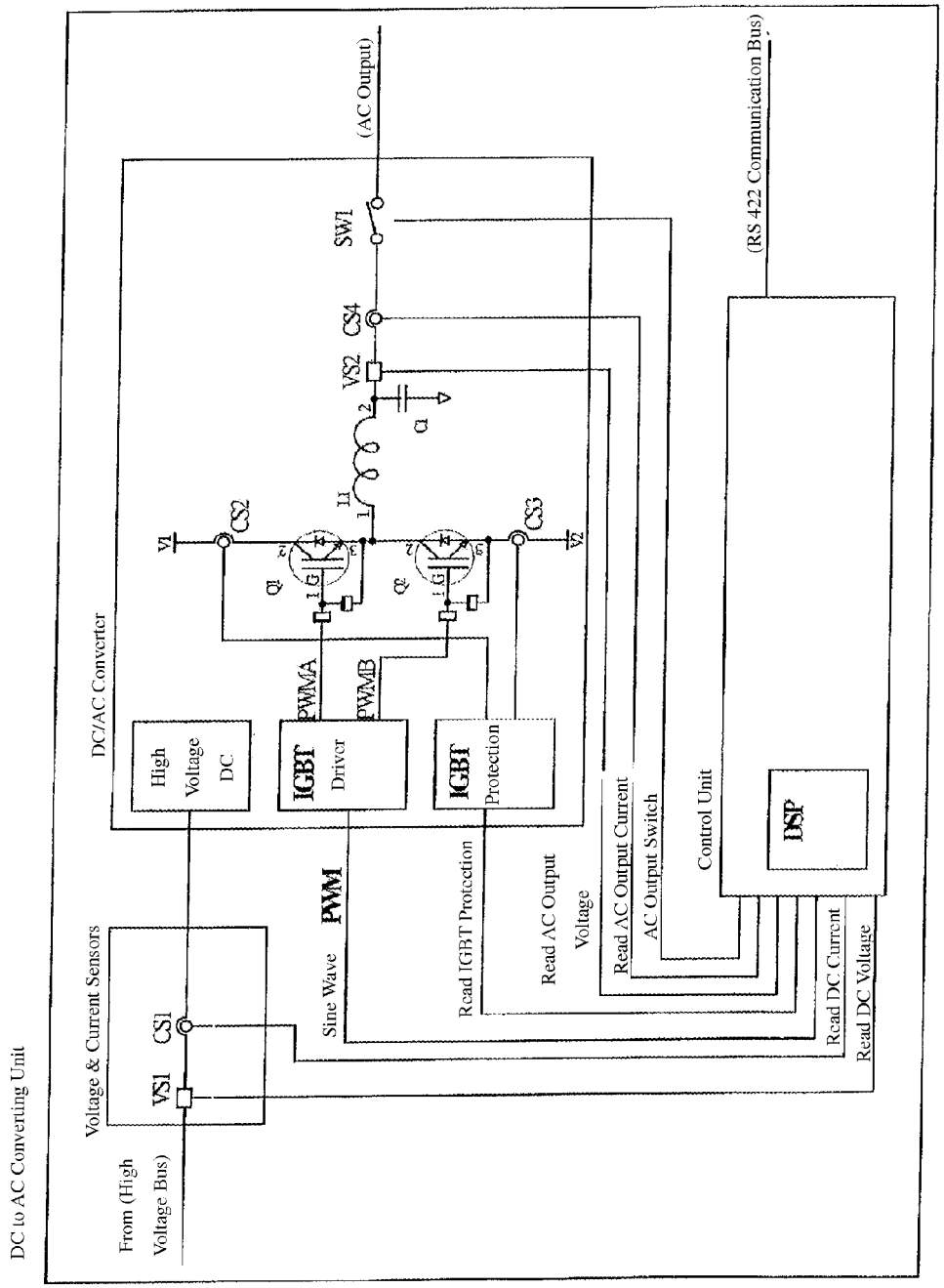
FIG. 9 is a diagram illustrating an example of the DC to AC converting unit in an embodiment 2 of the present patent application.

FIG. 9 is a diagram illustrating an example of the DC to AC converting unit in FIG. 5. As shown in FIG. 9, the DC to AC converting unit may comprise a DC/AC converter and so on. The DC/AC converter includes an IGBT driver, an IGBT switch tube and an LC filter. The specific implementation of the DC to AC converting unit may be determined according to the specific condition and not bound by the above limiting example. A digital sine wave for driving the IGBT driver is produced through the digital signal processing (DSP) of the control unit. Herein, the IGBT driver further drives the IGBT switch tube. Subsequently, the high frequency portion is filtered out through LC filtering to result in a sine wave AC voltage. Further, the AC voltage is fed back to the unit under test through the renewable AC bus. As a result, the feedback efficiency is enhanced so as to further reduce the energy waste.

In the control unit of this embodiment with reference to FIGS. 5-9, the numerical value acquisition unit comprises a plurality of voltage sensors and current sensors used for real-time sampling. The voltage sensors and the current sensors are configured to sample the voltages and currents of the system share supply unit, the renewable load unit, the DC to AC converting unit and the switching unit respectively. The functions of the balance determining unit and the signal sending unit are achieved by one of the micro control unit (MCU) and digital signal processing (DSP) unit.

The constant current balance is achieved through the above-mentioned power supply aging system without installing an isolated transformer. The load current of the unit under test can be controlled independently so as to meet the demand of the unit under test. In addition, the feedback efficiency is enhanced so as to further reduce the energy waste.

Additionally, the control unit is capable of determining whether the system is under balanced operation depending on the monitored current and voltage in real time when the system state changes. When the system is determined to be out of balanced operation, the control unit sends the control signal to the system share supply unit or the switching unit for the real-time control so as to re-achieve system constant current balance.

For example, when the $14^{th}$ unit under test in FIG. 5 suddenly breaks, the control unit monitors in real time and detects that the output current of the renewable load unit #RL-14 corresponding to this unit under test is zero. Based on this, the control unit determines the whole system is out of balanced operation. At this time, two methods as follows may be employed by the control unit to re-achieve the system constant current balance: (1) sends the control signal to the system share supply unit so as to increase the output power thereof; or (2) sends the control signal to one of the remaining thirty-eight switching units in part B, such as the $22^{nd}$ switching unit #PSCS-22, so as to switch the switching unit for having its corresponding unit under test to be connected with the AC line rather than the renewable AC bus. As a result, the system constant current balance can be re-achieved.

It can be seen from the above-mentioned embodiment the system share supply unit and the renewable load unit output to the DC to AC converting unit in parallel through the high voltage DC bus, and the DC to AC converting unit feeds back the AC voltage to the unit under test through the renewable AC bus. Therefore, the DC load sharing can be balanced without the installation of isolated transformer or the authorization from power supplying department, thus reducing the cost. Besides, the load current of the unit under test can be controlled independently so as to meet the demand of the unit under test. In addition, the feedback efficiency can be increased so as to further reduce energy waste.

Embodiment 3

The power supply aging system in this embodiment is basically the same as that described in the embodiment 2. The main differences between the power supply aging system in this embodiment and the one in embodiment 2 are described herein. Being an exception that the functions such as sampling analog signals including voltage and current analog signals and carrying out an AC/DC conversion on the analog signals are carried out by hardware, other functions of the control unit are implemented by software function module which is operated by a host computer for performing on-line control on the system share supply unit, the renewable load unit, the DC to AC converting unit and the switching unit. Besides, depending on different unit under tests, the respective control parameters of the system share supply unit, the renewable load unit, the DC to AC converting unit, the balance determining unit and the signal sending unit may be amended and set through a man-to-machine dialog box of the host computer. Therefore, the system is more intuitional in operation, enhanced in adaptability and suitable for unit under tests of various forms and specifications.

Embodiment 4

A load balance control method of internal grid-connection is provided in this embodiment of the present patent application.

Figure 10:
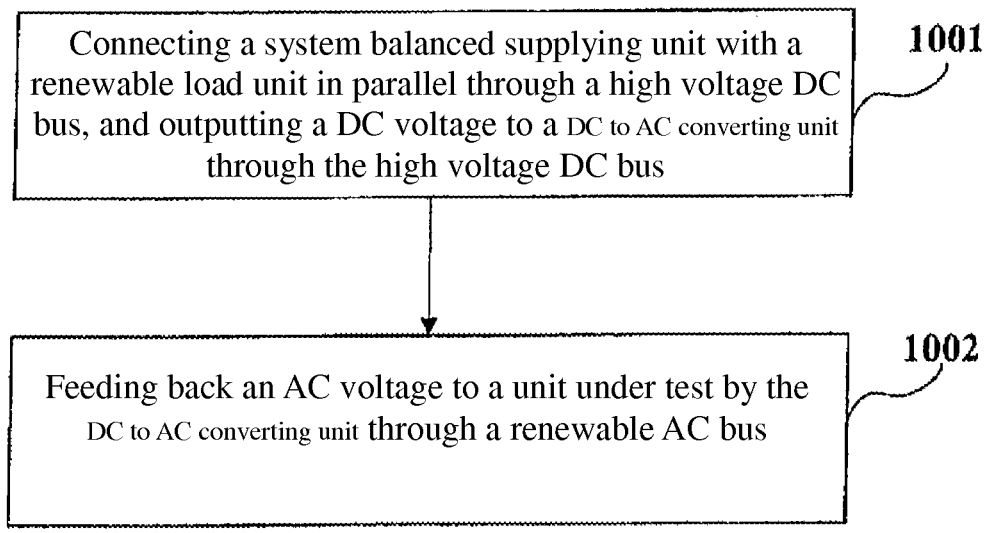
FIG. 10 is a flow chart for the internal grid-connection method in an embodiment 3 of the present patent application.

As shown in FIG. 10, the method comprises the following steps.

In step 1001, a system share supply unit connects with a renewable load unit in parallel by a high voltage DC bus, and a DC voltage is outputted to a DC to AC converting unit through the high voltage DC bus.

In step 1002, an AC voltage is fed back to a unit under test through a renewable AC bus by the DC to AC converting unit.

Wherein the system share supply unit connects with the AC line and outputs a fixed voltage and the renewable load unit connects with the unit under test and outputs a constant current. Herein, the system share supply unit is configured to produce the DC voltage required by the system constant current balance, the renewable load unit is configured to convert a low DC voltage outputted by the unit under test to a high DC voltage, and the DC to AC converting unit is configured to convert the high DC voltage to the AC voltage required by the unit under test.

In this embodiment, the system share supply unit is set to output fixed voltage, and the renewable load unit is set to output constant current. Moreover, the output voltage of the renewable load unit is set higher than the fixed voltage of the system share supply unit by 3-5%. The output current of the system share supply unit can be calculated as a total current minus the sum of the parallel constant current.

Hereinafter, setting of the voltages and currents of the system share supply unit and the renewable load unit will be described in details by examples with reference to FIG. 11.

Figure 11:
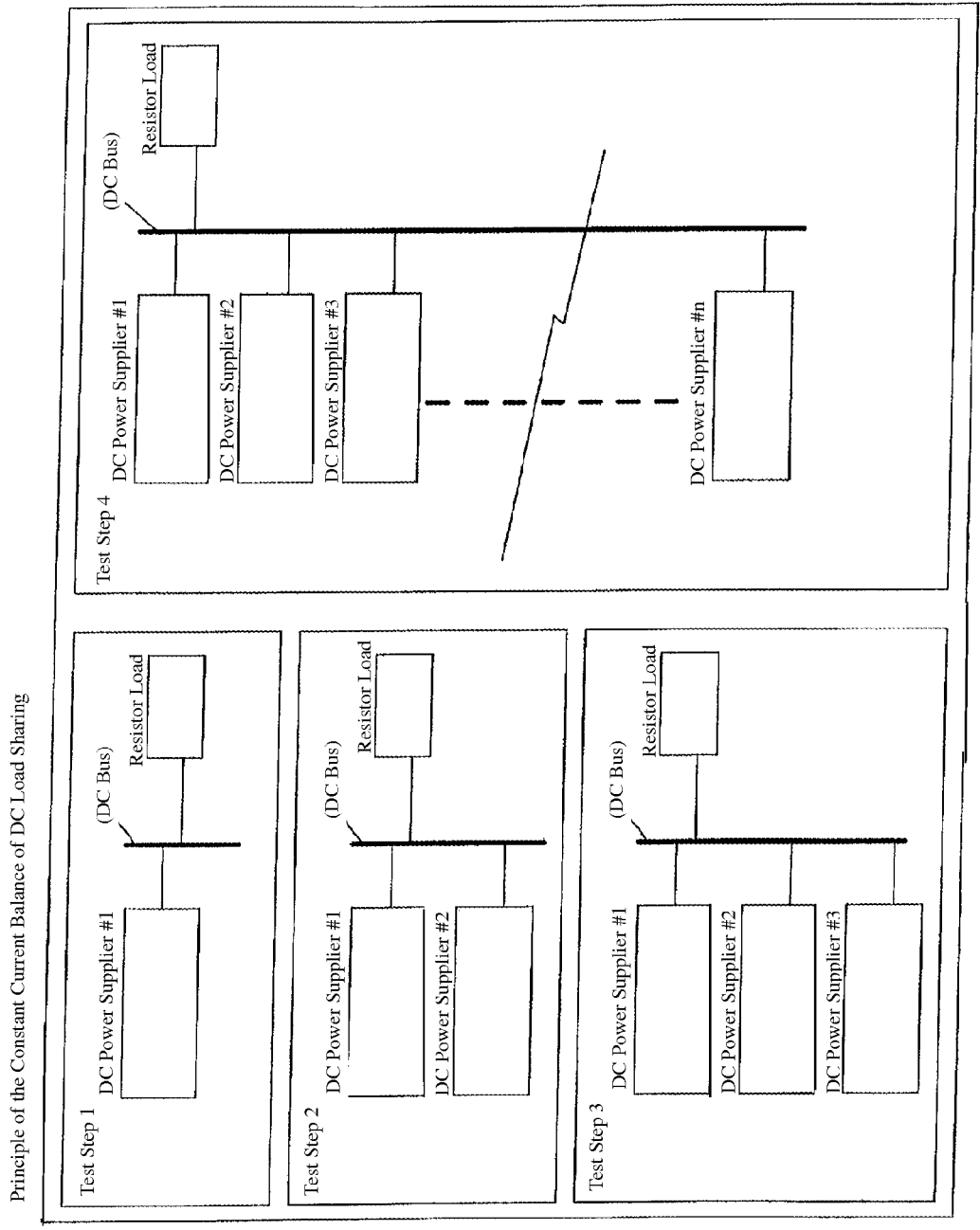
FIG. 11 is a schematic diagram for the constant current balance of DC load sharing in an embodiment 3 of the present patent application.

FIG. 11 is a schematic diagram for the constant current balance of DC load sharing. It is used as illustration for setting the currents and voltages of the system share supply unit and the renewable load unit. For sake of simplicity, the load in FIG. 11 is a resistor of 12 ohm, the current of the DC bus is 1 A, the fixed voltage outputted by the system share supply unit is 12V, the output current of the renewable load unit is constant to be 0.2 A, and the output voltage of the renewable load unit can be set higher than the fixed voltage by 5%, that is, 12V+12V*5%=12.6V. The specific implementation may be determined according to the specific condition instead and not bound by the above limiting example.

As shown in step 1 of FIG. 11, when only the system share supply unit outputs to the DC bus, the output current of the system share supply unit is A1=1 A.

As shown in step 2 of FIG. 11, when one renewable load unit is connected in parallel, the output current of the system share supply unit is A1=1 A−0.2 A=0.8 A.

As shown in step 3 of FIG. 11, when one more renewable load unit is further connected in parallel, the output current of the system share supply unit is A1=1 A−0.2 A−0.2 A=0.6 A.

As shown in step 4 of FIG. 11, when n−1 renewable load units are connected in parallel, the output current of the system share supply unit is A1=1 A−0.2 A*(n−1).

The above-mentioned examples merely provide exemplary illustrations on setting the currents and voltages of the system share supply unit and the renewable load unit. However, the specific implementation may be determined according to the specific condition and not bound by the above examples.

It can be seen from the above-mentioned embodiment that the system share supply unit and the renewable load unit output to the DC to AC converting unit through the high voltage DC bus in parallel; and the DC to AC converting unit feeds back the AC voltage to the unit under test through the renewable AC bus. Therefore, the DC load sharing can be balanced without the installation of isolated transformer or the authorization from power supplying department, thus reducing the cost. In addition, the feedback efficiency can be increased so as to further reduce energy waste.

Embodiment 5

A load balance control method of internal grid-connection is provided in this embodiment of the present patent application.

Figure 12:
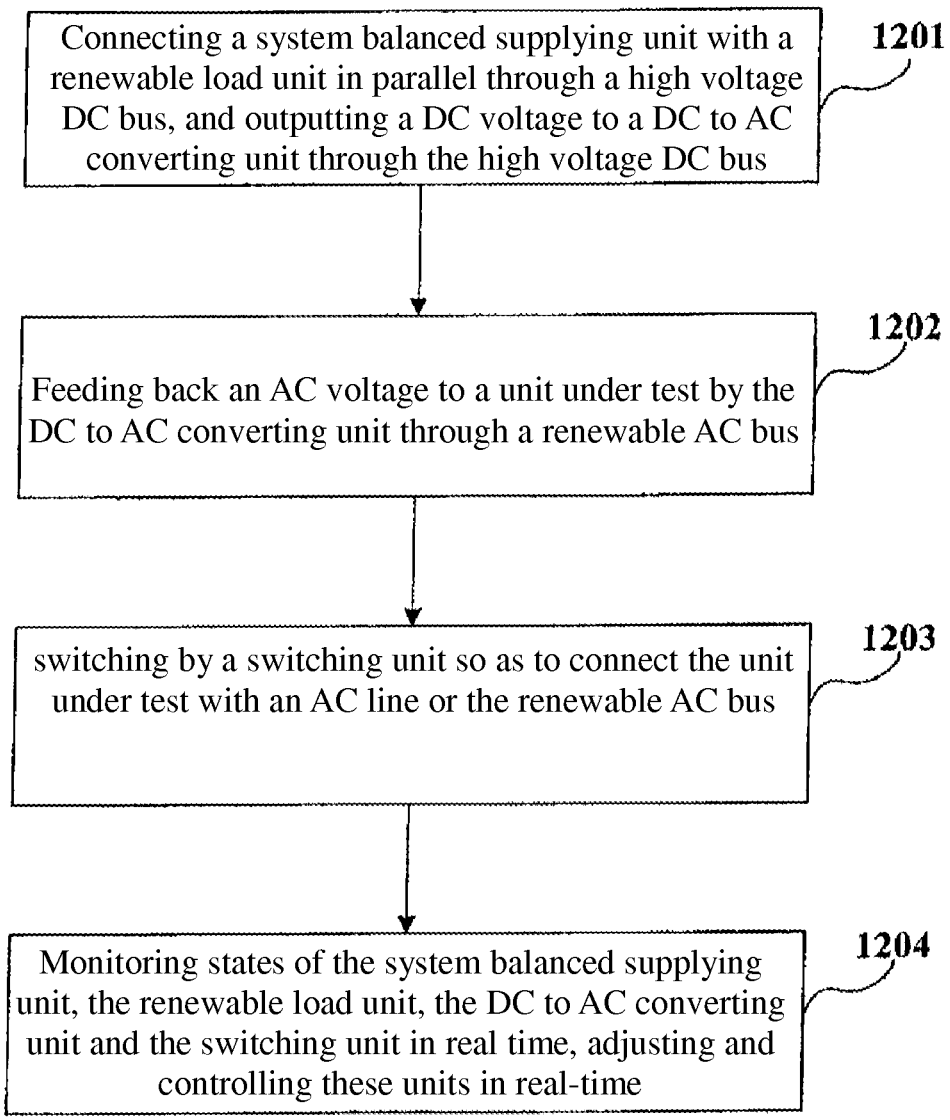
FIG. 12 is a flow chart for the internal grid-connection method in an embodiment 4 of the present patent application.

As shown in FIG. 12, the method includes following steps.

In step 1201, a system share supply unit connects with a renewable load unit in parallel by a high voltage DC bus, and a DC voltage is outputted to a DC to AC converting unit through the high voltage DC bus.

In this embodiment, the system share supply unit connects with the AC line and outputs a fixed voltage, and the renewable load unit connects with a unit under test and outputs a constant current. Herein, the system share supply unit is configured to produce a high DC voltage required by the system constant current balance, and the renewable load unit is configured to convert the low DC voltage outputted by the unit under test to the high DC voltage.

In step 1202, an AC voltage is fed back to the unit under test through a renewable AC bus by the DC to AC converting unit.

In this embodiment, the DC to AC converting unit is configured to convert the high DC voltage to the AC voltage required by the unit under test.

In step 1203, the unit under test is connected with an AC line or the renewable AC bus through switching the switching unit. The AC line or the renewable AC bus is operated to supply the AC voltage required to the unit under test.

In step 1204, the states of the system share supply unit, the renewable load unit, the DC to AC converting unit and the switching unit are monitored in real time, real-time adjustments and controls are carried out on such units as well.

Figure 13:
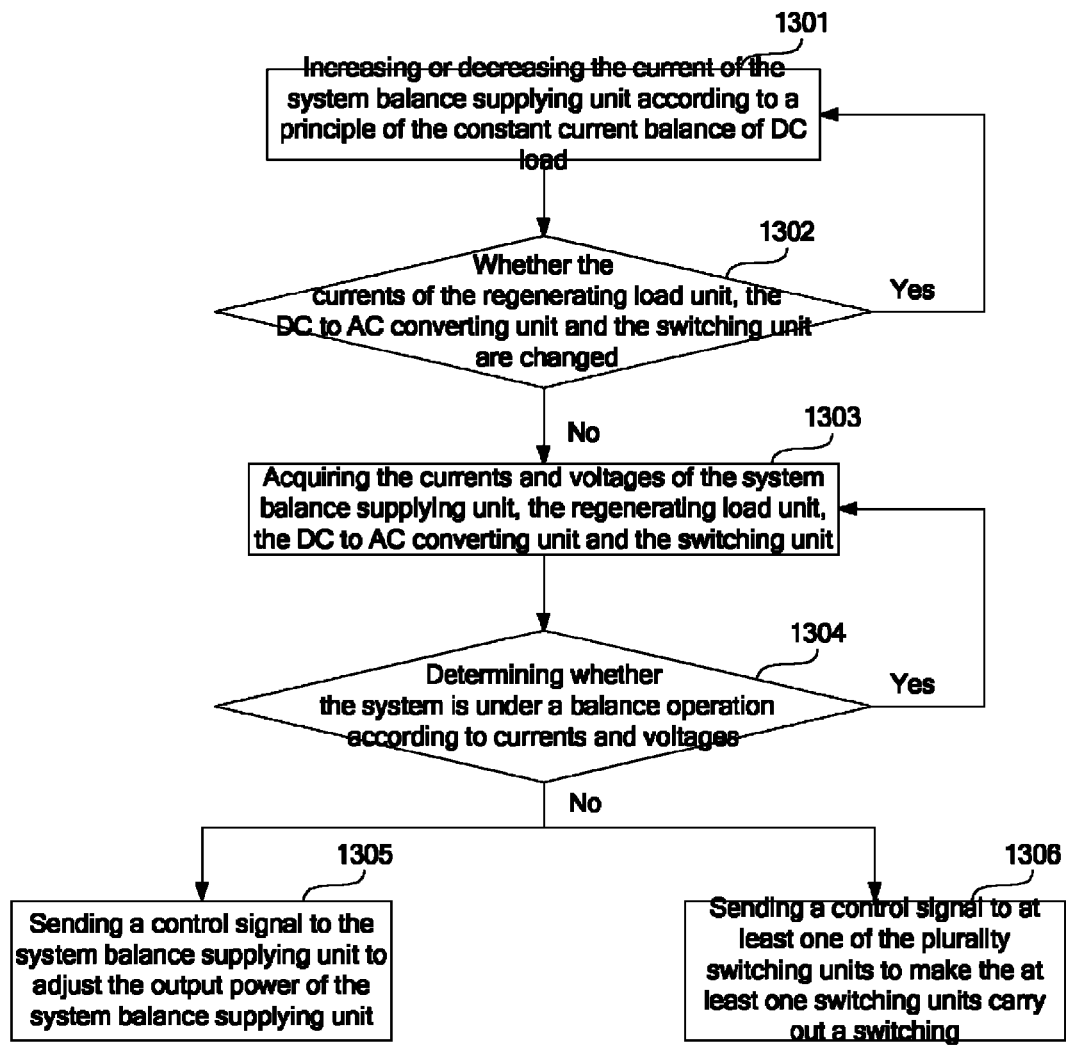
FIG. 13 is a flow chart for the control process in an embodiment 4 of the present patent application.

As shown in FIG. 13, the step 1204 may comprise following the steps.

In step 1301, the current of the system share supply unit is increased/decreased according to the principle of the constant current balance of DC load.

In step 1302, whether the currents of the renewable load unit, the DC to AC converting unit and the switching unit are changed is determined. If so, the step 1301 will be carried out; if not, the step 1303 will be carried out.

In step 1303, the currents and voltages of the system share supply unit, the renewable load unit, the DC to AC converting unit and the switching unit are acquired through a communication bus.

In step 1304, whether the power supply aging system is under a balanced operation depending on the currents and voltages is determined. If so, the step 1303 will be carried out to carry on the real-time monitoring; if not, the step 1305 or step 1306 will be carried out.

In step 1305, a control signal is sent to the system share supply unit for adjusting the output power of the system share supply unit.

In step 1306, a control signal is sent to at least one of plurality of switching units of the power supply aging system so that at least one switching units can carry out the switching.

It can be seen from the above-mentioned embodiment that the system share supply unit and the renewable load unit output to the DC to AC converting unit through the high voltage DC bus in parallel; and the DC to AC converting unit feeds back the AC voltage to the unit under test through the renewable AC bus. Therefore, the DC load sharing can be balanced without the installation of isolated transformer or the authorization from power supplying departments, thus reducing the cost. Besides, the load current of the unit under test can be controlled independently so as to meet the demand of the unit under test. Additionally, the feedback efficiency can be increased so as to further reduce energy waste.

Specialized persons in the field should further recognize that, units and algorithm steps of the respective example, which are described with reference to the embodiments disclosed in the context, may be implemented by electronic hardware, computer software or the combinations thereof. In order to illustrate the interchangeability between hardware and software clearly, constitutions and steps of each example are generally described according to their functions in the above-mentioned description. Whether these functions are executed in the manner of hardware or software depends upon the constraint condition of the specific application and design of the technical solution. Specialized skills can be applied to implement the described function for specific applications, while such implementations should not be deemed to go beyond the scope of the present patent application.

Steps of the method or algorithm, which are described with reference to the embodiments disclosed in the context, can be carried out through hardware, software module executed by a processor or the combination thereof. The software module can be set in a random access memory (RAM), a memory, a read-only memory (ROM), an electrically programmable ROM, and an electrically erasable programmable ROM, a register, a hard disk, a removable hard disk, a CD-ROM or a well-known storage medium in any other form in the art.

The above-mentioned implementation has further described the objectives, technical solution and advantageous effects of the present patent application in details. It should be understood that all mentioned above are the specific implementations of the present patent application instead of limitation to the scope of the present patent application. Any amendment, equivalent and improvement made within the spirit and principle of the present patent application is within the scope of protection of the present patent application.

The invention claimed is:

1. A power supply aging system, comprising:
   a system share supply unit configured to connect with an AC line, output a fixed voltage to a high voltage DC bus and produce a DC voltage;
   a renewable load unit configured to connect with a tested unit, connect with the system share supply unit in parallel and output a constant current to the high voltage DC bus;
   a DC to AC converting unit configured to connect with the high voltage DC bus, output to a renewable AC bus and convert a high DC voltage to an AC voltage needed by the tested unit;
   a switching unit configured to connect with the tested unit on one end and connect with the AC line or the renewable AC bus on the other end, select the AC line or the renewable AC bus to provide the tested unit the AC voltage required by the tested unit by switching through a switch;
   a control unit configured to monitor states of the system share supply unit, the renewable load unit, the DC to AC converting unit and the switching unit in real-time, and further to adjust and control the above mentioned units in real-time; and further configured to maintain a constant current balance of the power supply aging system by increasing and decreasing an output current of the system share supply unit and/or selecting the AC line or the renewable AC bus as a power supply of the tested unit.

2. The power supply aging system of claim 1, wherein the control unit comprising:
   a numerical value acquisition unit configured to acquire currents and voltages of the system share supply unit, the renewable load unit and the DC to AC converting unit;
   a balance determining unit configured to determine whether the power supply aging system is under a balanced operation according to the currents and voltages acquired by the numerical value acquisition unit;
   a signal sending unit configured to send a control signal to the system share supply unit when the balance determining unit determines that the power supply aging system is out of balanced operation, so as to adjust the output power of the system share supply unit.

3. The power supply aging system of claim 1, wherein the control unit further comprising:
   a current sensor configured to sample currents of the system share supply unit, the renewable load unit or the DC to AC converting unit;
   a voltage sensor configured to sample voltages of the system share supply unit, the renewable load unit or the DC to AC converting unit;
   a micro control unit (MCU) and/or a digital signal processing (DSP) unit configured to determine whether the power supply aging system is under a balanced operation according to sample data, adjust the output power of the system share supply unit in real time, and/or select the AC line or the renewable AC bus as the power supply of the tested unit.

4. The power supply aging system of claim 2, wherein the power supply aging system comprises a plurality of switching units, each of which is connected with one tested unit;
   wherein a control signal is sent to at least one of the plurality of switching units when the control unit determines that the power supply aging system is out of the balance operation, so as to switch the at least one switching units.

5. The power supply aging system of claim 2, wherein the system share supply unit comprises:
   a rectifier configured to rectify the AC line,
   an AC/DC converter configured to convert an output of the rectifier to the fixed voltage and then output to the high voltage DC bus;
   a PWM controller configured to control an output voltage and/or output current of the AC/DC converter according to the control signal of the control unit.

6. The power supply aging system of claim 2, wherein the renewable load unit comprises:
   a DC/DC converter configured to output the constant current to the high voltage DC bus under the control of the control unit.

7. The power supply aging system of claim 2, wherein the DC to AC converting unit comprises:
   a DC/AC converter configured to convert a direct current inputted by the high voltage DC bus to an alternative current and output to the renewable AC bus.

8. The power supply aging system of claim 2, wherein the monitoring, controlling and a data logging of the system share supply unit, the renewable load unit, the DC to AC converting unit and the switching unit are achieved by the control unit through a communication bus.

9. The power supply aging system of claim 4, further comprising a plurality of renewable load units, each of which corresponds to one tested unit and one switching unit.

10. The power supply aging system of claim 4, wherein the switching unit comprises a transfer switch having two input contacts, one of which is connected with the AC line while the other one of which is connected with the renewable AC bus; wherein the input contacts are switched according to the control signal of the control unit so that the AC line or the renewable AC voltage is selected to access the tested unit.

11. The power supply aging system of claim 6, wherein the DC/DC converter comprises a PWM controller, a switch module, a transformer and a rectifier, wherein,
   a PWM signal produced by the PWM controller drives the switch module to resonate under the control of the control unit;
   a voltage change is carried out on a resonance signal by the transformer;
   the rectifier outputs a direct current to the renewable AC bus after rectification.

12. The power supply aging system of claim 7, wherein the DC/AC converter comprises an IGBT driver, an IGBT switch tube and an LC filter; wherein the IGBT driver is driven by the control unit, the IGBT switch tube is driven by the IGBT driver and then outputs a sine wave AC voltage through LC filtering;

the AC voltage is fed back to the input end of the switching unit through the renewable AC bus.

13. A load balance control method, wherein comprising the following processes:

connecting a system share supply unit with a renewable load unit in parallel through a high voltage DC bus, and outputting a DC voltage to a DC to AC converting unit;

converting the DC voltage to an AC voltage by the DC to AC converting unit for feeding back to a tested unit and outputting through a renewable AC bus;

monitoring states of the system share supply unit, the renewable load unit and the DC to AC converting unit in real time, adjusting and controlling the above units in real-time by a control unit;

switching according to an instruction of the control unit by a switching unit so as to select an AC line or the renewable AC bus for accessing an input terminal of the tested unit and for providing the tested unit with the AC voltage needed by the tested unit.

14. The load balance control method of claim 13, wherein, monitoring currents and/or voltages of the system share supply unit, the renewable load unit and the DC to AC converting unit in real time by the control unit;

controlling the system share supply unit to increase/decrease its output current by the control unit according to a principle of a constant current balance of DC load.

15. The load balance control method of claim 13, wherein, monitoring currents and/or voltages of the system share supply unit, the renewable load unit and the DC to AC converting unit in real time by the control unit;

switching according to an instruction of the control unit by a switching unit so as to select an AC line or the renewable AC bus for accessing an input terminal of the tested unit and for providing the tested unit with the AC voltage needed by the tested unit.

16. The load balance control method of claim 13, wherein, acquiring currents and voltages of the system share supply unit, the renewable load unit and the DC to AC converting unit in real time by the control unit;

controlling the system share supply unit to increase/decrease its output current by the control unit according to a principle of a constant current balance of DC load; meanwhile, switching by a switching unit according to an instruction of the control unit so as to select one or more tested units to access the AC line or the renewable AC bus.

17. The load balance control method of any one of claim 14, wherein the renewable load unit, the switching unit and the tested unit are in one-to-one correspondence with each other; the renewable load unit is suitable for different voltage inputs and current inputs under the control of the control unit.

18. The load balance control method of any one of claim 14, wherein the system share supply unit is set to output a fixed voltage, and the output current of the system share supply unit can be calculated as a total current minus the sum of the parallel constant current.

19. The load balance control method of claim 18, wherein the renewable load unit is set to have a constant current output, and its output voltage is higher than the fixed voltage of the system share supply unit by 3-5%.

* * * * *